(12) United States Patent
Elgaard et al.

(10) Patent No.: US 12,113,558 B2
(45) Date of Patent: Oct. 8, 2024

(54) TRANSMITTER CIRCUIT

(71) Applicant: Telefonaktiebolaget LM Ericsson (publ), Stockholm (SE)

(72) Inventors: Christian Elgaard, Lund (SE); Henrik Sjöland, Lund (SE)

(73) Assignee: Telefonaktiebolaget LM Ericsson (Publ), Stockholm (SE)

( * ) Notice: Subject to any disclaimer, the term of this patent is extended or adjusted under 35 U.S.C. 154(b) by 103 days.

(21) Appl. No.: 18/003,026

(22) PCT Filed: Jun. 22, 2020

(86) PCT No.: PCT/EP2020/067335
§ 371 (c)(1),
(2) Date: Dec. 22, 2022

(87) PCT Pub. No.: WO2021/259448
PCT Pub. Date: Dec. 30, 2021

(65) Prior Publication Data
US 2023/0421184 A1    Dec. 28, 2023

(51) Int. Cl.
*H04K 1/02*    (2006.01)
*H03F 1/32*    (2006.01)
(Continued)

(52) U.S. Cl.
CPC ............. *H04B 1/04* (2013.01); *H03F 1/3241* (2013.01); *H03F 3/24* (2013.01); *H03G 3/3042* (2013.01);
(Continued)

(58) Field of Classification Search
CPC .............. H04B 1/04; H04B 2001/0408; H04B 1/0475; H03F 1/3241; H03F 3/24;
(Continued)

(56) References Cited

U.S. PATENT DOCUMENTS 4,225,897 A    9/1980    Kaplan
5,023,937 A    6/1991    Opas
(Continued)

FOREIGN PATENT DOCUMENTS

CN    202931370 U    5/2013
CN    104868905 A    8/2015
(Continued)

OTHER PUBLICATIONS

U.S. Appl. No. 62/984,825, filed Mar. 4, 2020.*
(Continued)

*Primary Examiner* — Phuong Phu
(74) *Attorney, Agent, or Firm* — Weisberg I.P. Law, P.A.

(57) ABSTRACT

A transmitter circuit has a signal input for receiving an analog input signal and a local oscillator (LO) input for receiving an LO signal. A mixer circuit has a first input, a second input, and an output. The second input of the mixer circuit is connected to a signal input of the transmitter circuit. A PA circuit has an input connected to the output of the mixer circuit, and an output. A control circuit generates a phase-control signal and a gain-control signal in response to an envelope of the analog input signal. A phase-control circuit generates a phase-adjusted LO signal in response to the LO signal and the phase-control signal and supplies the phase-adjusted LO signal to the first input of the mixer circuit. A gain-control circuit controls a gain of the transmitter circuit in response to the gain-control signal.

17 Claims, 8 Drawing Sheets

(51) Int. Cl.
  *H03F 3/24* (2006.01)
  *H03G 3/30* (2006.01)
  *H04B 1/04* (2006.01)
  *H04L 25/03* (2006.01)
  *H04L 25/49* (2006.01)

(52) U.S. Cl.
  CPC ............... *H03F 2200/102* (2013.01); *H04B 2001/0408* (2013.01)

(58) Field of Classification Search
  CPC ............ H03F 2200/102; H03F 1/3247; H03G 3/3042; H04W 88/06
  USPC ................................ 375/296, 297, 285, 284
  See application file for complete search history.

(56) References Cited

U.S. PATENT DOCUMENTS

| | | | | |
|---|---|---|---|---|
| 5,699,383 | A | * | 12/1997 | Ichiyoshi .............. H03F 1/3247 332/162 |
| 6,201,446 | B1 | | 3/2001 | Ananth |
| 7,443,237 | B1 | | 10/2008 | Liu |
| 8,295,877 | B2 | * | 10/2012 | Hui ...................... H04W 88/06 370/395.5 |
| 9,300,253 | B2 | | 3/2016 | Hasegawa |
| 2002/0130646 | A1 | | 9/2002 | Zadeh et al. |
| 2006/0229036 | A1 | | 10/2006 | Muller et al. |
| 2008/0186101 | A1 | | 8/2008 | Arakali et al. |
| 2010/0109779 | A1 | | 5/2010 | Pham et al. |
| 2010/0283894 | A1 | | 11/2010 | Horan et al. |
| 2015/0130540 | A1 | | 5/2015 | Hasegawa |
| 2015/0280660 | A1 | | 10/2015 | Azin et al. |
| 2018/0159567 | A1 | | 6/2018 | Matsuura et al. |
| 2019/0190472 | A1 | | 6/2019 | Snoeij et al. |
| 2021/0281219 | A1 | * | 9/2021 | Khlat .................. H04B 1/0475 |

FOREIGN PATENT DOCUMENTS

| | | |
|---|---|---|
| EP | 1011192 A2 | 6/2000 |
| WO | 2020143934 A1 | 7/2020 |

OTHER PUBLICATIONS

Chinese Office Action and English summary dated Oct. 10, 2023 for Application No. 201980088536.4, consisting of 11 pages.
U.S. Office Action dated Nov. 24, 2023 for U.S. Appl. No. 17/421,289, filed Jul. 7, 2021, consisting of 14 pages.
International Search Report and Written Opinion dated Dec. 2, 2019 for International Application No. PCT/EP2019/073046 filed Aug. 29, 2019, consisting of 13-pages.
International Search Report and Written Opinion dated Mar. 16, 2021 for International Application No. PCT/EP2020/067335 filed on Jun. 22, 2020, consisting of 11 pages.
Liu, Jenny Yi-Chun et al., Millimeter-Wave Self-Healing Power Amplifier With Adaptive Amplitude and Phase Linearization in 65-nm CMOS; IEEE Transactions on Microwave Theory and techniques, vol. 60, No. 5, May 2012, consisting of 11 pages.
Kousai, Shouhei et al., A 28.3 mW PA-Closed Loop for Linearity and Efficiency Improvement Integrated in a +27.1 dBm WCDMA CMOS Power Amplifier; IEEE Journal of Solid-State Circuits, vol. 47, No. 12, Dec. 2012, consisting of 10 pages.
Weng, Shih-Min et al., A 60-GHz Adaptively Biased Power Amplifier with Predistortion Linearizer in 90-nm CMOS; IEEE/MTT-S International Microwave Symposium; 2018, consisting of 4 pages.
Elgaard, Christian et al., A 27GHz Adaptive Bias Variable Gain Power Amplifier and T/R Switch in 22nm FD-SOI CMOS for 5G Antenna Arrays; IEEE Radio Frequency Integrated Circuits Symposium, 2019, consisting of 4 pages.
Pang, Jian et al., A 28GHz CMOS Phased-Array Transceiver Featuring Gain Invariance Based on LO Phase Shifting Architecture with 0.1-Degree Beam-Steering Resolution for 5G New Radio; IEEE Radio Frequency Integrated Circuits Symposium, 2018, consisting of 4 pages.

* cited by examiner

TRANSMITTER CIRCUIT

CROSS-REFERENCE TO RELATED APPLICATION

This application is a Submission Under 35 U.S.C. § 371 for U.S. National Stage Patent Application of International Application Number: PCT/EP2020/067335, filed Jun. 22, 2020 entitled "TRANSMITTER CIRCUIT," the entirety of which is incorporated herein by reference.

TECHNICAL FIELD

The present disclosure relates to a transmitter circuit.

BACKGROUND

A power amplifier (PA) is an amplifier circuit that is used, for instance, in wireless communication for feeding a signal to be transmitted into an antenna. Two important performance parameters for a PA is efficiency and linearity. There is typically a trade-off between linearity and efficiency. Therefore, a PA that is relatively efficient typically needs to be linearized to meet linearity requirements not to ruin error vector magnitude (EVM) and/or produce too high adjacent channel leakage ratio (ACLR). To enable further integration, PAs used in for example emerging 5th generation (5G) mobile telecommunications systems will need to handle multiple frequency bands at the same time, which makes such requirements on EVM and ACLR relatively tough to meet.

Linearization of a PA can be done using digital predistortion (DPD). DPD can compensate for both amplitude to amplitude variation (AM-AM) and amplitude to phase variation (AM-PM).

Digital predistortion can be relatively power hungry and complex. This is particularly true for modulated signals with high bandwidths (BW). When combining multiple signal bands separated in frequency at the input of one PA, the equivalent BW that the DPD must linearize is not only the combined BW of the modulated signals but also include the empty frequency bands between the signal bands. These relatively hard BW requirements can make it impractical to implement a straight-forward polynomial based DPD solution. Furthermore, a relatively high sampling rate will be needed, which leads to a relatively high power consumption in the DPD.

SUMMARY

The inventors have developed a transmitter circuit architecture that enables counteraction of AM-AM and AM-PM distortion.

According to a first aspect, there is provided a transmitter circuit. It comprises a signal input for receiving an analog input signal and a local oscillator (LO) input for receiving an LO signal. It also comprises a mixer circuit configured to generate a frequency-upconverted signal. The mixer circuit has a first input, a second input, and an output for outputting an output signal of the mixer circuit. The second input of the mixer circuit is connected to the signal input of the transmitter circuit.

The transmitter circuit further comprises a PA circuit having an input connected to the output of the mixer circuit and an output for outputting an output signal of the transmitter circuit.

Furthermore, the transmitter circuit comprises a control circuit configured to generate a phase-control signal and a gain-control signal in response to an envelope of the analog input signal.

Moreover, the transmitter circuit comprises a phase-control circuit configured to generate a phase-adjusted LO signal in response to the LO signal and the phase-control signal and supply the phase-adjusted LO signal to the first input of the mixer circuit.

In addition, the transmitter circuit comprises a gain-control circuit configured to control a gain of the transmitter circuit in response to the gain-control signal.

The above provides a relatively simple circuitry facilitating counteraction of AM-PM and AM-AM distortion typically occurring in transmitter circuits, e.g. due to nonlinearities in power amplifiers.

In some embodiments, the gain-control circuit is comprised in the mixer circuit and is configured to operate on the analog input signal to generate an intermediate analog signal, and the mixer circuit is configured to generate the frequency-upconverted signal in response to the phase-adjusted LO signal and the intermediate analog signal, and to output the frequency-upconverted signal at the output of the mixer circuit.

In some embodiments, the gain-control circuit is comprised in the mixer circuit and is configured to operate on the frequency-upconverted signal to generate a gain-adjusted frequency-upconverted signal, and the mixer circuit is configured to generate the frequency-upconverted signal in response to the phase-adjusted LO signal and the analog input signal, and to output the gain-adjusted frequency-upconverted signal at the output of the mixer circuit.

In some embodiments, the gain-control circuit is comprised in the PA circuit.

In some embodiments, the phase-control circuit comprises a variable capacitor, the capacitance of which is controlled by the phase-control signal.

In some embodiments, the phase-control circuit comprises a current-limiting circuit controlled by the phase-control signal.

In some embodiments, the control circuit has a digital input configured to receive a digital signal representing the envelope of the analog input signal.

In some embodiments, the control circuit is configured to generate an analog signal representing the envelope of the analog input signal from the analog input signal and/or from the output signal of the mixer circuit.

According to a second aspect, there is provided an integrated circuit comprising the transmitter circuit of the first aspect.

According to a third aspect, there is provided an electronic apparatus comprising the transmitter circuit of the first aspect. The electronic apparatus may e.g. be a communication apparatus, such as (but not limited to) a wireless communication device or a base station for a cellular communications system.

Further embodiments are defined in the dependent claims. It should be emphasized that the term "comprises/comprising" when used in this specification is taken to specify the presence of stated features, integers, steps, or components, but does not preclude the presence or addition of one or more other features, integers, steps, components, or groups thereof.

DETAILED DESCRIPTION

Figure 1:
FIG. 1 illustrates a communication environment.

FIG. 1 illustrates a communication environment wherein embodiments of the present disclosure may be employed. A wireless communication device 1, or wireless device 1 for short, of a cellular communications system is in wireless communication with a radio base station 2 of the cellular communications system. The wireless device 1 may be what is generally referred to as a user equipment (UE). The wireless devices 1 is depicted in FIG. 1 as a mobile phone, but may be any kind of device with cellular communication capabilities, such as a tablet or laptop computer, machine-type communication (MTC) device, or similar. Furthermore, a cellular communications system is used as an example throughout this disclosure. However, embodiments of the present disclosure may be applicable in other types of systems as well, such as but not limited to WiFi systems.

The radio base station 2 and wireless device 1 are examples of what in this disclosure is generically referred to as communication apparatuses. Embodiments are described below in the context of a communication apparatus in the form of the radio base station 2 or wireless device 1. However, other types of communication apparatuses can be considered as well, such as a WiFi access point or WiFi enabled device.

Figure 2:
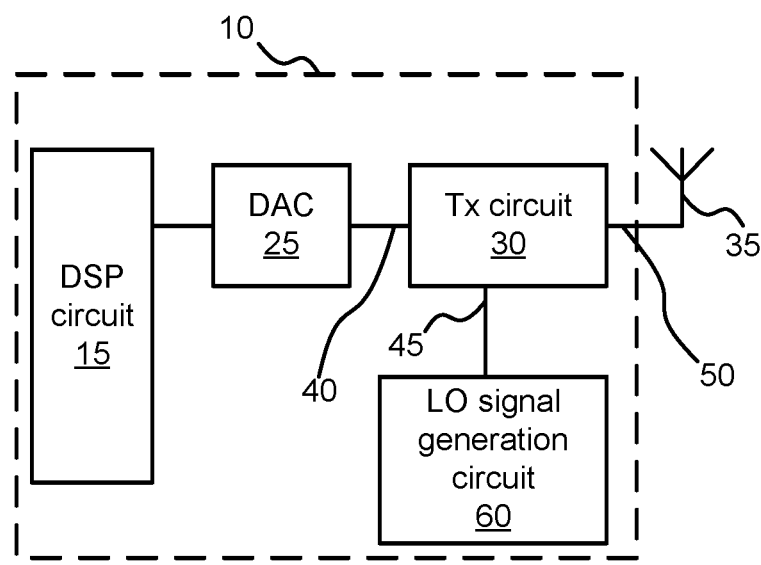
FIG. 2 is a block diagram of a transmitter.

FIG. 2 is a block diagram of an embodiment of a transmitter 10, which can be comprised in a communication apparatus, such as the radio base station 2 or the wireless device 1. In the embodiment illustrated in FIG. 2, the transmitter 10 comprises a digital signal processing (DSP) circuit 15. The DSP circuit 15 may e.g. be what is commonly referred to as baseband processor. The DSP circuit 15 may e.g. be configured to perform various digital signal processing tasks, such as one or more of coding, modulation, inverse FFT (IFFT), mapping, etc.

Figure 3:
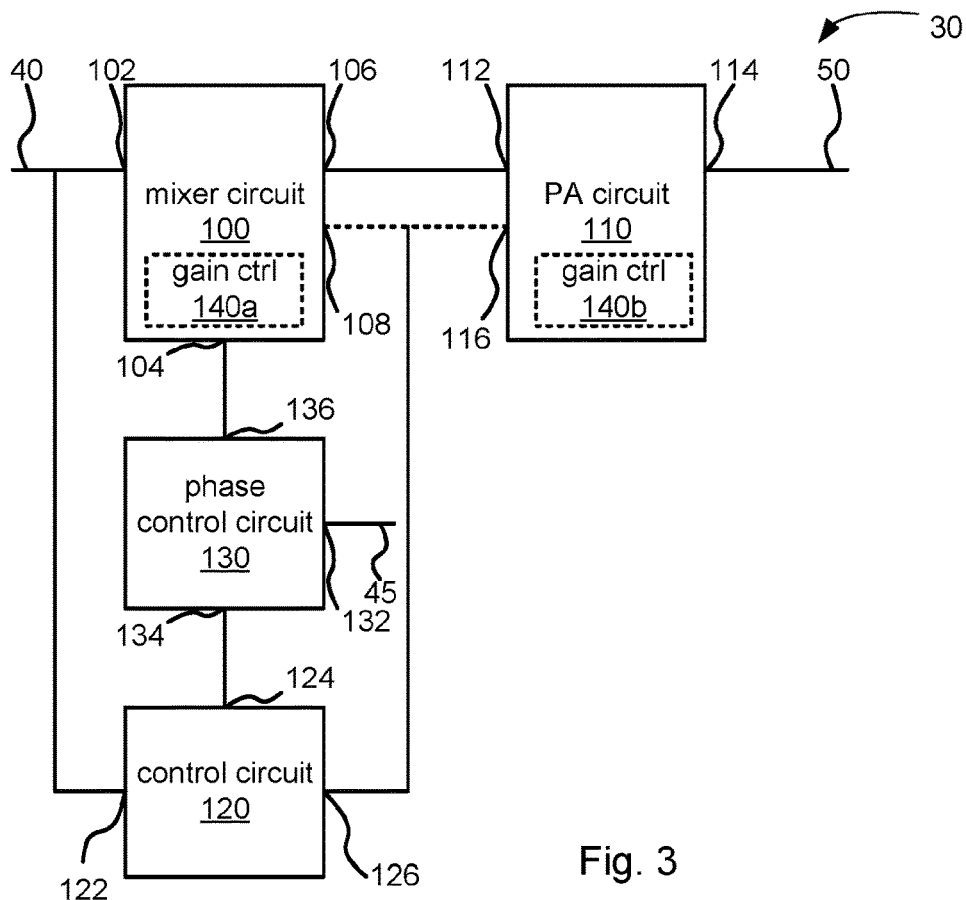
FIG. 3 is a block diagram of a transmitter circuit.

Furthermore, in the embodiment illustrated in FIG. 2, the transmitter 10 comprises a transmitter (Tx) circuit 30 and a digital-to-analog converter (DAC) 25. The DAC 25 is connected to the DSP circuit 15 and configured to receive, as an input signal of the DAC 25, a digital representation of a signal to be transmitted from the DSP circuit 15. The DAC 25 is further configured to convert the signal to be transmitted to an analog representation, which is an output signal of the DAC 25. The Tx circuit 30 is connected between the DAC 25 and an antenna 35. The Tx circuit 30 is configured to receive the output signal from the DAC 25 at a signal input 40 of the Tx circuit 30 and transform the output signal from the DAC 25 to a format suitable for transmission via the antenna 35. In FIG. 2, the Tx circuit 30 has an output 50 connected to the antenna 35. Furthermore, in the embodiment illustrated in FIG. 2, the transmitter 10 comprises a local oscillator (LO) signal generation circuit (60). The LO-signal generation circuit (60) may e.g. comprise a phase-locked loop (PLL), such as an analog or a digital PLL, or any other type of synthesizer suitable for generating the LO signal. The Tx circuit 30 has an LO input 45 for receiving the LO signal from LO-signal generation circuit 60. FIG. 3 is a block diagram of the Tx circuit 30 according to embodiments of the present disclosure. It comprises the above-mentioned signal input 40 for receiving an analog input signal, for instance from the DAC 25 in FIG. 2. Furthermore, it comprises the above-mentioned LO input 45 for receiving an LO signal, for instance from the LO-signal generation circuit 60 in FIG. 2. Moreover, in FIG. 3, the Tx circuit 30 comprises a mixer circuit 100 configured to generate a frequency-upconverted signal. The mixer circuit has a first input 104 and a second input 102. The mixer circuit 100 also has an output 106 for outputting an output signal of the mixer circuit 100. The second input 102 of the mixer circuit 100 is connected to the signal input 40 of the transmitter circuit 30.

In FIG. 3, the Tx circuit 30 comprises a power amplifier (PA) circuit 110 having an input 112 connected to the output 106 of the mixer circuit 100 and an output 114 for outputting an output signal of the transmitter circuit 30. The latter is indicated in FIG. 3 by having the output 114 of the PA circuit 110 connected to the output 50 of the Tx circuit 30.

In FIG. 3, the Tx circuit 30 comprises a control circuit 120. According to some embodiments, the control circuit 120 is configured to generate a phase-control signal (at an output 124) and a gain-control signal (at an output 126) in response to an envelope of the analog input signal. This facilitates counteraction of AM-AM distortion and AM-PM distortion, as is further described below.

In FIG. 3, the Tx circuit 30 comprises a phase-control circuit 130. According to some embodiments, the phase-control circuit 130 is configured to generate a phase-adjusted LO signal in response to the LO signal and the phase-control signal and supply the phase-adjusted LO signal to the first input 104 of the mixer circuit 100. For instance, as indicated in FIG. 3, the phase-control circuit 130 may have an input 132 connected to the LO input 45 for receiving the LO signal, an input 134 connected to the output 124 of the control circuit 120 for receiving the phase-control signal, and an output 136 connected to the first input 104 of the mixer circuit 100 for supplying the phase-adjusted LO signal to the mixer circuit 110.

According to embodiments of the present disclosure, the Tx circuit 30 comprises a gain-control circuit configured to control a gain of the transmitter circuit 30 in response to the gain-control signal. Throughout this disclosure, reference signs starting with 140 are used for the gain-control circuit. The gain-control circuit can be located in various different parts of the Tx circuit 30, for instance in the mixer circuit 100, as indicated with the reference sign 140a in FIG. 3, or in the PA circuit 110, as indicated with the reference sign 140b in FIG. 3, or partly in the mixer circuit 100 and partly in the PA circuit 110. As indicated in FIG. 3, the mixer circuit 100 may have an input 108 for receiving the gain-control signal. Similarly, as indicated in FIG. 3, the PA circuit 110 may have an input 116 for receiving the gain-control signal.

The phase-control circuit 130 can be implemented in many different ways. Some examples are illustrated in FIGS. 4-8.

Figure 4:
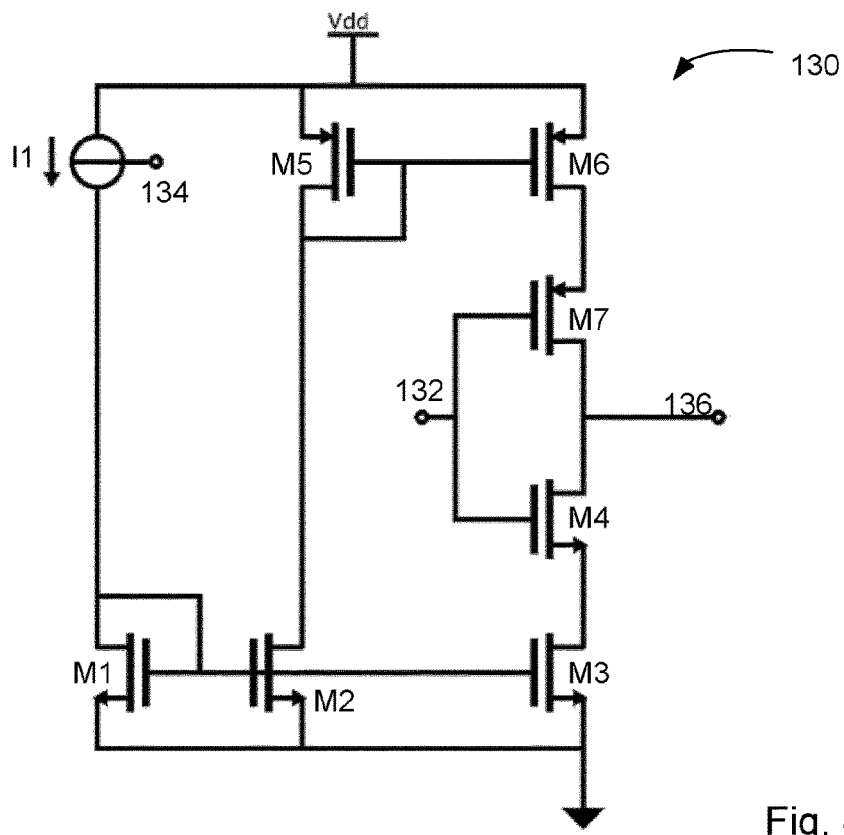
FIGS. 4-8 are schematic circuit diagrams.

In some embodiments, the phase-control circuit 130 comprises a current-limiting circuit controlled by the phase-control signal. An example of such a circuit is shown in FIG. 4, which is also known as a current-starved inverter. The input 132 is connected to the gates of transistors M4 and M7. The output 136 is connected to the drains of transistors M4 and M7. The transistors M3 and M6 are configured to limit the current through transistor M4 and transistor M7, respectively. Hence, in the example shown in FIG. 4, the current-limiting circuit comprises transistors M3 and M6. Transistors M6 and M3 are biased by a bias circuit comprising transistors M1, M2, and M5, and controllable current source I1. In the following, I1 is used to denote both the current source itself and the controllable current that it generates. The current I1 is mirrored by transistor M1 to transistors M2 and M3, thereby properly biasing the gate terminal of transistor M3 to generate a drain current with an upper limit. Furthermore, the drain current of transistor M2 is supplied to transistor M5, which in turn mirrors this current to transistor M6, thereby properly biasing the gate terminal of transistor M6 to generate a drain current with an upper limit. The current I1 sets the (approximate) value of the upper limits of the drain currents of M3 and M6. If, for instance, the sizes of transistors M1, M2, and M3 are equal, and the sizes of transistors M5 and M6 are equal, said upper limits are both approximately equal to I1. Thus, by varying I1, the upper limits of said drain currents can be varied. M3 limits the maximum pull-down current and M6 limits the maximum pull-up current. At the output a capacitive load is assumed, which is e.g. true if the output is connected to one or more transistor gates. By slowing down the speed of charging (pull-up current) and discharging (pull-down current) of the capacitive load, a delay is introduced. The delay is controlled by I1. In FIG. 4, the input 134 is connected to a control terminal of the current source I1 that controls the current of the current source I1. Hence, the current I1, and therefore also the phase of the phase-adjusted LO signal at output 136, is controlled by the phase-control signal. The LO signal has a relatively high amplitude, similar to a square wave. Slowing down the edges of such a signal provides a phase shift without significantly changing the amplitude.

In some embodiments, the phase-control circuit 130 comprises a variable capacitor, the capacitance of which is controlled by the phase-control signal. Examples of this are shown in FIGS. 5-7.

Figure 5:
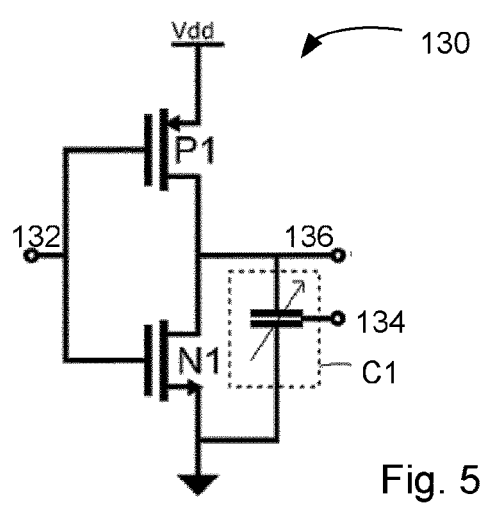

FIG. 5 shows an example where the phase-control circuit 130 is implemented as an inverter, comprising transistors N1 and P1, with a variable capacitor C1 as load. The input 132 is connected to the gates of the transistors N1 and P1, and the output 136 is connected to the drains of the transistors N1 and P1. The capacitor C1 is connected between the output 136 and ground, but it could also be connected between the output 136 and some other signal ground node, such as the supply voltage node Vdd. The input 134 is connected to a control terminal of the capacitor C1 that controls the capacitance of the capacitor C1. Hence, the capacitance of C1 is controlled by the phase-control signal. Varying the capacitance of the capacitor C1 also varies the phase of the phase-adjusted LO signal at the output 136. The time it takes to charge and discharge the node connected to the output 136 depends on the current being provided by P1/N1 and the capacitive load. For a given transistor size it will take longer time if the capacitive load increases resulting in a longer time delay.

Figure 6:
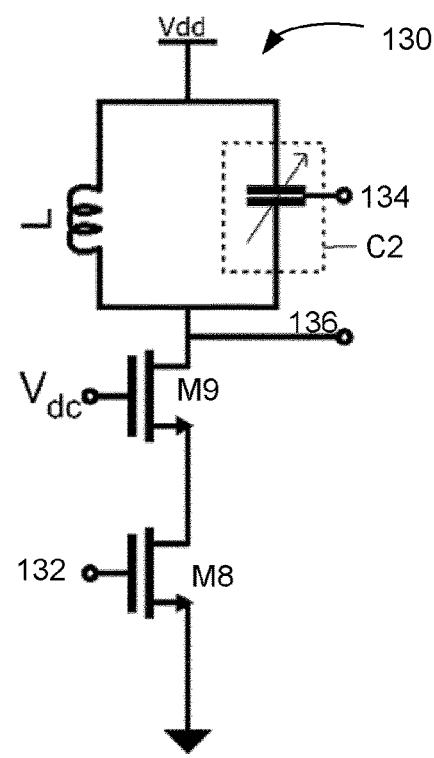

FIG. 6 shows an example where the phase-control circuit 130 is implemented as buffer amplifier with a tuned LC tank load. It comprises a transistor M8 and a transistor M9. The input 132 is connected to the gate of the transistor M8. The drain of the transistor M8 is connected to the source of the transistor M9. The gate of the transistor M9 is biased with a voltage $V_{dc}$. The output 136 is connected to the drain of the transistor M9. The transistor M9 is thus configured as a cascode transistor. The above-mentioned LC tank comprises an inductor L in parallel with a variable capacitor C2. The input 134 is connected to a control terminal of the capacitor C2 that controls the capacitance of the capacitor C2. Hence, the capacitance of C2 is controlled by the phase-control signal. Varying the capacitance of the capacitor C2 in turn varies the resonance frequency of the LC tank circuit and thus also the phase of the output impedance of the whole circuit shown in FIG. 6 at the LO signal frequency. Thereby, the phase of the phase-adjusted LO signal at the output 136 is also varied. At resonance the imaginary, or reactive, part is zero i.e. the output impedance is real. Below resonance the complex part is positive and above it is negative. Depending on operation frequency, increasing capacitive value of C2 the imaginary part will either become less positive, switch from positive to negative, or become more negative, which all results in an increasing delay, meaning a larger phase shift.

Figure 7:
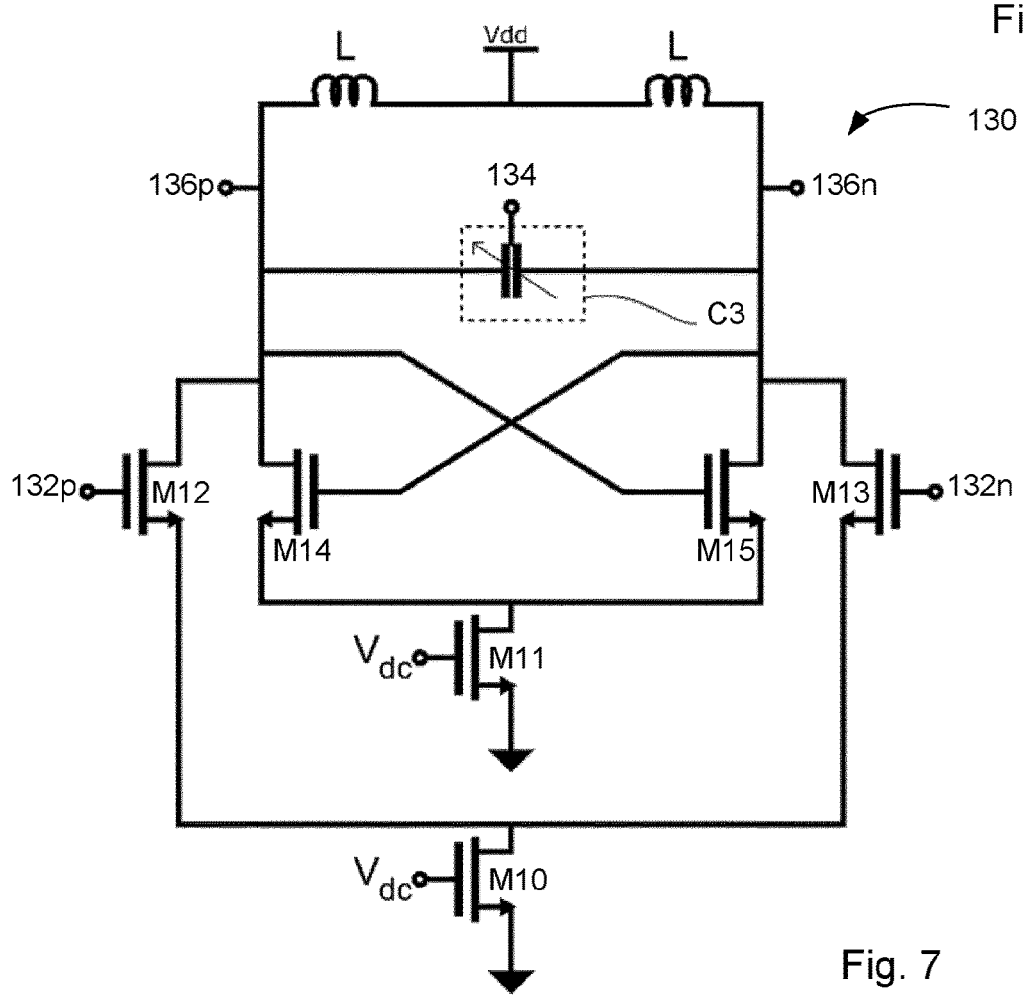

FIG. 7 shows an example where the phase-control circuit 130 is implemented as differential tuned injection-locked LO buffer. The input 132 is a differential input with terminals 132p and 132n. Similarly, the output 136 is a differential output with terminals 136p and 136n. In FIG. 7, the phase-control circuit 130 comprises transistors M10 and M11 configured to operate as bias current source, both biased at their gate terminals with a voltage Va. Furthermore, the phase-control circuit 130 shown in FIG. 7 comprises input transistors M12 and M13, which both have their source terminals connected to the drain terminal of transistor M10. The input terminals 132p and 132n are connected to the gate terminal of transistor M12 and the gate terminal of transistor M13, respectively. The drain terminal of transistor M12 is connected to the output terminal 136p, and the drain terminal of transistor M13 is connected to the output terminal 136n. In FIG. 7, the phase-control circuit 130 further comprises a cross-coupled pair of transistors M14 and M15. The source terminals of transistors M14 and M15 are both connected to the drain terminal of transistor M11. The drain terminal of transistor M14 is connected to the output terminal 136p, and the drain terminal of transistor M15 is connected to the output terminal 136n. The gate terminal of transistor M14 is connected to the output terminal 136n, and the gate terminal of transistor M15 is connected to the output terminal 136p. An LC resonance circuit comprising two equally sized series-connected inductors L in parallel with a variable capacitor C3 is connected between the output terminals 136p and 136n. The two inductors can be implemented as a differential inductor with a center tap. A power-supply node Vdd is connected to the node between the inductors L (the center tap in case of a differential inductor).

The input 134 is connected to a control terminal of the capacitor C3 that controls the capacitance of the capacitor C3. Hence, the capacitance of C3 is controlled by the phase-control signal. Varying the capacitance of the capacitor C3 in turn varies the resonance frequency of the LC resonance circuit and thus also the phase of the output impedance of the whole circuit shown in FIG. 7 at the LO signal frequency. Thereby, the phase of the phase-adjusted LO signal at the output 136 is also varied in a similar manner as for the circuit in FIG. 6 described above.

A differential phase-control circuit 130 can also, for instance, be implemented by duplicating a single-ended implementation of the phase-control circuit 130, such as any of those illustrated in FIGS. 4-6. Furthermore, in case of a quadrature Tx circuit, which requires an in-phase (I) LO signal and a quadrature-phase (Q) LO signal with a 90 degree mutual phase shift, the phase-control circuit 130 can, for instance, be implemented with two of the implementations described above (single-ended or differential), where one is used for the I LO signal and the other is used for the Q LO signal.

Figure 8:
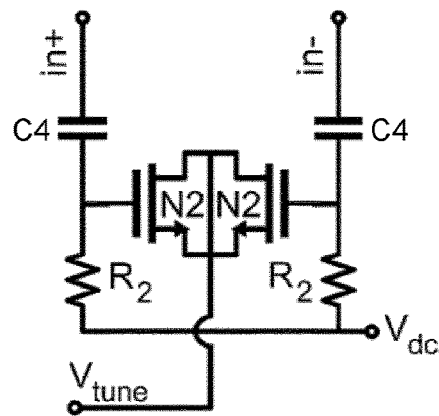

FIG. 8 shows an example of how a variable capacitor, such as C1, C2, or C3 (FIGS. 5-7), can be implemented. In FIG. 8, the variable capacitor comprises two identical transistors N2, that have both their drains and their sources shorted to a common node connected to a tuning terminal $V_{tune}$. The DC voltage at the gate terminals of the transistors N2 are set through the identical resistors R2 from the terminal $V_{dc}$. Note that the label "$V_{dc}$" is used in the figures to generally indicate a DC voltage, but that it is not necessarily the same DC voltage in all figures. Furthermore, two identical fixed capacitors C4 are included in the variable capacitor. One of the capacitors C4 is connected between a terminal in+ and the gate of one of the transistors N2. The other one of the capacitors C4 is connected between a terminal in− and the gate of the other one of the transistors N2. Varying the voltage at the terminal $V_{tune}$ changes the channel capacitances of the transistors N2 and, thereby, the overall capacitance between the terminals in+ and in−. Other types of variable capacitors are known to a skilled person and may be used as well.

Figure 9:
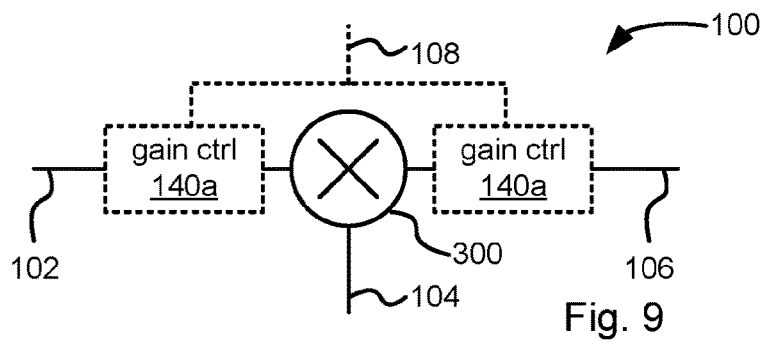
FIGS. 9-10 illustrate embodiments of a mixer circuit.
Figure 10:
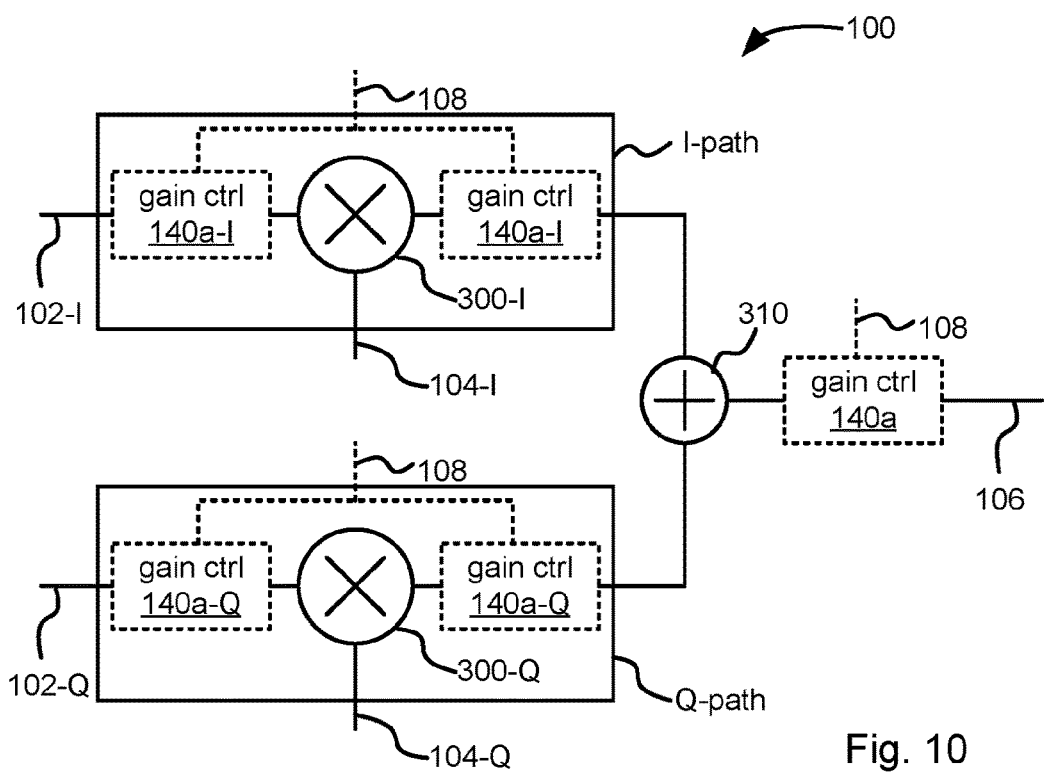

FIGS. 9 and 10 illustrate examples of how the mixer-circuit 100 can be implemented. FIG. 9 shows a real, or non-quadrature, mixer circuit 100, and FIG. 10 shows a quadrature mixer circuit 100.

In FIG. 9, the mixer circuit 100 comprises a mixer 300 configured to perform the frequency up-conversion. The LO input 104 of the mixer circuit 100 is connected to an LO input of the mixer 300.

In FIG. 10, the mixer circuit 100 comprises a mixer 300-I and a mixer 300-Q configured to perform the frequency up-conversion. The mixer 300-I and the mixer 300-Q are located in an I-path and a Q-path, respectively, of the mixer circuit 100. The first input 104 of the mixer circuit 100 has an I-port 104-I and a Q-port 104-Q. The I-port 104-I is connected to an LO input of the mixer 300-I. The Q-port 104-Q is connected to an LO input of the mixer 300-Q. Similarly, the second input 102 of the mixer circuit 100 has an I-port 102-I and a Q-port 102-Q, connected to input ports of the I-path and the Q-path, respectively. The analog input signal is, in this case, a quadrature signal having an I component and a Q component. The quadrature mixer circuit 100 illustrated in FIG. 10 further comprises an adder circuit 310 configured to sum the outputs from the I-path and the Q-path to generate the output signal of the mixer circuit 100 at the output 106.

Dotted boxes in FIGS. 9 and 10 illustrate possible placements of the gain-control circuit 140a in embodiments where the gain-control circuit 140a is comprised in the mixer circuit 100. Reference signs 140a-I and 140a-Q are used in FIG. 10 for sub circuits of the gain-control circuit 140a located in the I-path and the Q-path, respectively.

In some embodiments, the gain-control circuit 140a is comprised in the mixer circuit 100 and is configured to operate on the analog input signal to generate an intermediate analog signal. This is illustrated in FIG. 9 with the alternative that the gain-control circuit 140a is located before (i.e. to the left of in the figure) the mixer 300. Similarly, in FIG. 10, this is illustrated with the alternative that the gain-control sub circuits 140a-I and 140a-Q are located before (i.e. to the left of in the figure) the mixers 300-I and 300-Q, respectively. In such embodiments, the mixer circuit 100 may be configured to generate the frequency-upconverted signal in response to the phase-adjusted LO signal and the intermediate analog signal, and to output the frequency-upconverted signal at the output 106 of the mixer circuit 100. Referring to FIGS. 9-10, the intermediate analog signal is output by the gain-control circuit 140a (FIG. 9) or gain-control sub circuits 140a-I and 140a-Q (to the left of the mixer(s) 300, 300-I, 300-Q) and supplied to the mixer(s). In the embodiment illustrated in FIG. 10, the intermediate analog signal is a quadrature signal having an I component and a Q component.

In some embodiments, the gain-control circuit 140a, or each of the gain-control sub circuits 140a-I and 140a-Q, can be implemented with a variable-gain amplifier (VGA), the gain of which is controlled by the gain-control signal. In such embodiments, the intermediate analog signal is generated by the VGA (or VGAs in case of a quadrature transceiver) by amplification of the analog signal with said gain of the VGA.

In some embodiments, the gain-control circuit 140a, or each of the gain-control sub circuits 140a-I and 140a-Q, can be implemented with a summation circuit that adds, or superpositions, the gain-control signal onto the analog input signal to generate the intermediate analog signal. In case of a differential implementation, where the analog input signal and the intermediate analog signal are differential signals, the gain-control signal should be added to both the positive and negative signal component of the analog input signal, i.e. as a common-mode signal. In such embodiments, the gain of the Tx circuit 30 is controlled by changing the operating point of the mixer(s) 300, 300-I, 300-Q. This is described in more detail below with reference to FIGS. 13-14.

In some embodiments, the gain-control circuit 140a is comprised in the mixer circuit 100 and is configured to operate on the frequency-upconverted signal to generate a gain-adjusted frequency-upconverted signal. This is illustrated in FIG. 9 with the alternative that the gain-control circuit 140a is located after (i.e. to the right of in the figure) the mixer 300. Similarly, in FIG. 10, this is illustrated with the alternative that the gain-control sub circuits 140a-I and 140a-Q are located after (i.e. to the right of in the figure) the mixers 300-I and 300-Q, respectively, and the alternative that the gain-control circuit 140a is located after (i.e. to the right in the figure) the adder circuit 310. In such embodiments, the mixer circuit 100 may be configured to generate the frequency-upconverted signal in response to the phase-adjusted LO signal and the analog input signal. Furthermore, the mixer circuit may be configured to output the gain-adjusted frequency-upconverted signal at the output 106 of the mixer circuit 100. The gain-control circuit 140a, or gain-control sub circuits 140a-I and 140a-Q, may in such embodiments be implemented with VGA(s) with the gain controlled by the gain-control signal.

Referring to FIG. 9, said frequency-upconverted signal may be the output signal from the mixer 300 and said gain-adjusted frequency-converted signal may be the output signal from the gain-control circuit 140-a (located after the mixer 300).

Referring to FIG. 10 and the alternative where the gain-control circuit is implemented with the gain-control sub circuits 140a-I and 140a-Q located after the mixers 300-I and 300-Q, said frequency-upconverted signal may be the quadrature output signal from the mixers 300-I and 300Q, and said gain-adjusted frequency-converted signal may be the output signal from the adder circuit 310.

Referring to FIG. 10 and the alternative where the gain-control circuit 140a located after the adder-circuit 310, said frequency-upconverted signal may be the output signal from the adder circuit 310, and said gain-adjusted frequency-converted signal may be the output signal from the gain-control circuit.

As mentioned above, the gain-control circuit 140b is, in some embodiments, comprised in the PA circuit 110. For instance, the PA circuit 110, or an amplifier stage comprised in the PA circuit 110, may be implemented as a VGA, the gain of which is controlled by the gain-control signal. An example is described below with reference to FIG. 15.

In some embodiments, the control circuit 120 has a digital input configured to receive a digital signal representing the envelope of the analog input signal. For instance, the signal representing the envelop of the analog input signal may be generated in the digital domain by the DSP circuit 15.

In some embodiments, the control circuit 120 may be configured to generate an analog signal representing the envelope of the analog input signal from the analog input signal or from the output signal of the mixer circuit 100. Examples of circuits suitable for this purpose, which may be sub-circuits of the control circuit 120, are shown in FIG. 11 and FIG. 12.

Figure 11:
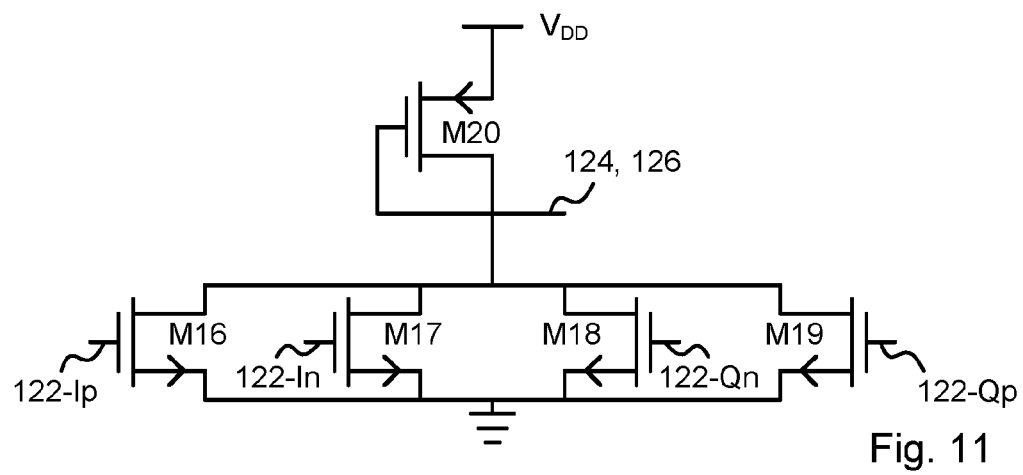

FIG. 11 shows an example of a baseband envelope detector configured to (at least approximately) generate an output proportional to $\sqrt{I^2+Q^2}$, where I is the baseband I component of the analog input signal and Q is the baseband Q component of the analog input signal. The baseband envelope detector comprises transistors M16, M17, M18, and M19. The gate terminal of M16 is connected to the terminal 122-Ip to receive the positive I-component of the analog input signal. The gate terminal of M17 is connected to the terminal 122-In to receive the negative I-component of the analog input signal. The gate terminal of M18 is connected to the terminal 122-Qn to receive the negative Q-component of the analog input signal. The gate terminal of M19 is connected to the terminal 122-Qp to receive the positive Q-component of the analog input signal. Each of the transistors M16-M19 has its drain terminal connected to an output of the baseband envelope detector. A diode-connected load transistor M20 is also connected to that output with its shorted drain and gate terminals. To a first approximation the output current from a MOS transistor is proportional to the square of the gate voltage minus threshold voltage when operating in saturation region. The transistor gates are biased close to the threshold voltage. For positive I polarity, M16 will then provide a drain current close to proportional to I squared and M17 will provide close to zero current. For negative I polarity M17 will instead provide a current close to proportional to I squared and M16 close to zero. The sum of the drain current of M16 and M17 will thus be close to proportional to I squared regardless of polarity of I. Transistors M18 and M19 will in the same way provide a combined drain current close to proportional to Q squared. Therefor the combined drain current from M16, M17, M18, and M19 is effectively proportional to $I_d=I^2+Q^2$. Similarly, the gate-source voltage magnitude minus the threshold voltage magnitude of the diode connected transistor M20 is proportional to the square root of its drain current $|V_{gs}|-|V_{th}| \propto \sqrt{I_d} \propto \sqrt{I^2+Q^2}$. From inspection of the circuit in FIG. 11, this equation gives that for zero envelope input, I=0 and Q=0, the circuit provides an output voltage close to VDD minus the magnitude of the threshold voltage of M20, and that non-zero envelopes result in lower output voltages, the voltage reduction being proportional to the envelope Env= $\sqrt{I^2+Q^2}$. A similar (complementary) circuit with the same functionality can be designed by replacing NMOS transistors with PMOS transistors, and vice versa, and interchanging the connections to $V_{DD}$ and ground. The output of the baseband envelope detector may be used as the gain-control signal and/or the phase-control signal, as indicated with the reference signs 124 and 126 in FIG. 11. Alternatively, the phase-control signal and/or the gain-control signal may be derived from the output of the baseband envelope detector.

Figure 12:
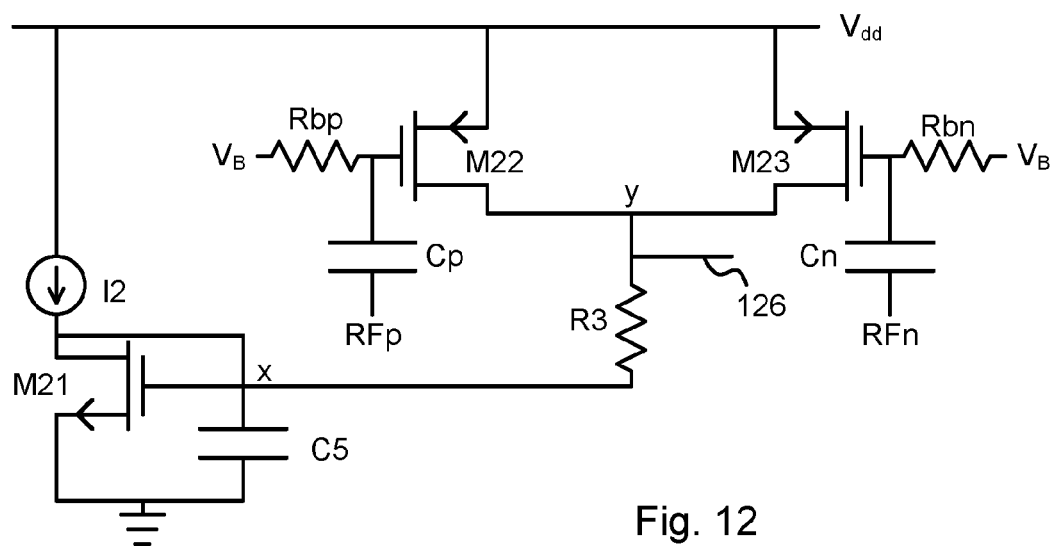
FIGS. 12-15 are schematic circuit diagrams.

FIG. 12 shows an example of an envelope detector operating on a differential input signal, which is a radio-frequency signal. This may, for instance, be the output signal from the mixer circuit. According to the embodiment illustrated in FIG. 12, the envelope detector comprises a transistor M21 having its drain terminal and its gate terminal connected to a first circuit node, labeled x, and its source terminal connected to a first supply terminal, such as ground. Furthermore, the envelope detector comprises a first current source, labeled 12, connected to the node x. Moreover, the envelope detector comprises a resistor R3 connected between the node x and a second circuit node, labeled y.

According to the embodiment illustrated in FIG. 12, the envelope detector comprises a transistor M22 configured to receive a first component RFp of the differential input signal at its gate terminal. M22 has its drain terminal connected to the node y and its source terminal connected to a second supply terminal, such as VDD. Similarly, according to the embodiment illustrated in FIG. 12, the envelope detector comprises a transistor M23 configured to receive a second component RFn of the differential input signal at its gate terminal. M23 also has its drain terminal connected to the node y and its source terminal connected to the second supply terminal. The gate terminals of M22 and M23 are configured to be biased by a voltage $V_B$. This can be accomplished in many different ways. In FIG. 12, $V_B$ is supplied to the gate terminals of M22 and M23 via resistors Rbp and Rbn, respectively. RFp and RFn are supplied to the gate terminals of M22 and M23, respectively, via capacitors Cp and Cn, respectively.

The envelope detector is configured to output an output signal at the node y. This output signal may, in some embodiments, be used as the gain-control signal. This is indicated with the reference sign 126 in FIG. 12. For instance, the gain-control signal generated in this way may be used as a bias voltage for the PA circuit 110 to control an operating point of the PA circuit, and thereby also control a gain of the PA circuit. This is further described below with reference to FIG. 15.

Figure 13:
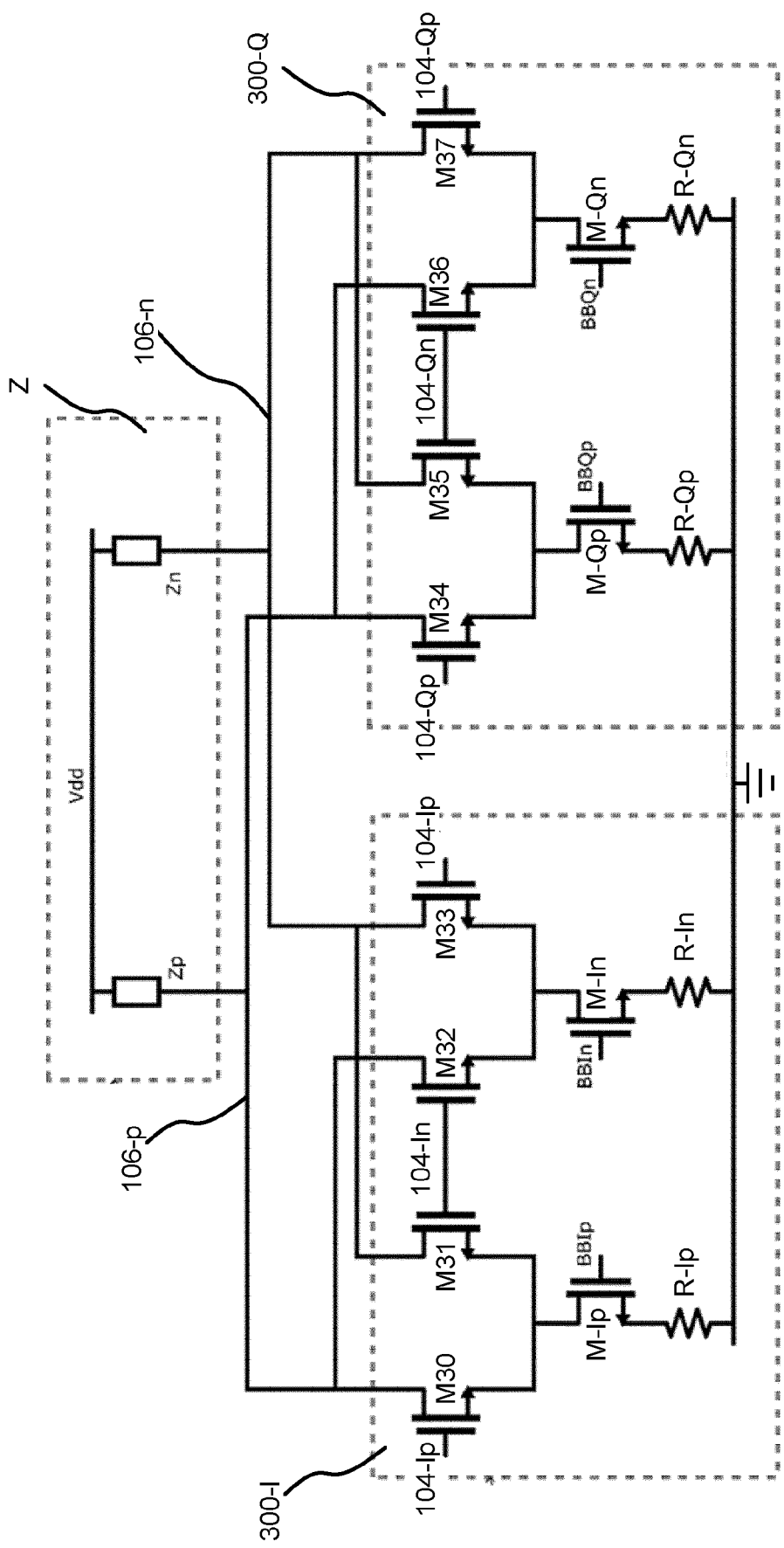

FIG. 13 illustrates an embodiment of part of the mixer circuit 100 in a differential quadrature implementation. According to this embodiment, the I-port 104-I of the first input 104 is a differential port with terminals 104-Ip and 104-In, and the Q-port 104-Q of the first input 104 is a differential port with terminals 104-Qp and 104-Qn. The output 106 is a differential output with output terminals 106-p and 106-n.

The mixer 300-I comprises transistors M30, M31, M32, and M33. The gate terminals of transistors M30 and M33 are connected to the terminal 104-Ip. The gate terminals of transistors M31 and M32 are connected to the terminal 104-In. Furthermore, the mixer 300-I comprises input transistors M-Ip and M-In. The drain terminal of transistor M-Ip is connected to the source terminals of transistors M30 and M31. The source terminal of transistor M-Ip is connected to ground via a resistor R-Ip. The drain terminal of transistor M-In is connected to the source terminals of transistors M32 and M33. The source terminal of transistor M-In is connected to ground via a resistor R-In. The mixer 300-I has a differential input with terminals BBIp and BBIn. BBIp is connected to the gate terminal of M-Ip. BBIn is connected to the gate terminal of M-In. The drain terminals of transistors M30 and M32 are connected to the output terminal 106-p. The drain terminals of transistors M31 and M33 are connected to the output terminal 106-n.

The mixer 300-Q comprises transistors M34, M35, M36, and M37. The gate terminals of transistors M34 and M37 are connected to the terminal 104-Qp. The gate terminals of transistors M35 and M36 are connected to the terminal 104-Qn. Furthermore, the mixer 300-Q comprises input transistors M-Qp and M-Qn. The drain terminal of transistor M-Qp is connected to the source terminals of transistors M34 and M35. The source terminal of transistor M-Qp is connected to ground via a resistor R-Qp. The drain terminal of transistor M-Qn is connected to the source terminals of transistors M36 and M37. The source terminal of transistor M-Qn is connected to ground via a resistor R-Qn. The mixer 300-Q has a differential input with terminals BBQp and BBQn. BBQp is connected to the gate terminal of M-Qp. BBQn is connected to the gate terminal of M-Qn. The drain terminals of transistors M34 and M36 are connected to the output terminal 106-p. The drain terminals of transistors M35 and M37 are connected to the output terminal 106-n.

In the embodiment illustrated in FIG. 13, the adder circuit 310 (see FIG. 10) is implemented with the above mentioned connections of the drain terminals of the transistors M30-M37 in combination with an impedance circuit Z, comprising a first load impedance Zp, connected between the output terminal 106-p and the supply voltage node Vdd, and a second load impedance Zn, connected between the output terminal 106-n and the supply voltage node Vdd.

The circuit in FIG. 13 is known as a Gilbert-type mixer. The operation of Gilbert-type mixers are well known and not further described herein.

Figure 14:
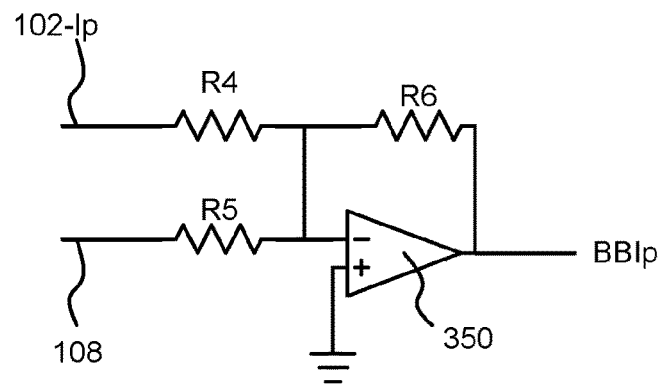

FIG. 14 illustrates how part of the gain-control sub-circuit 140a-I can be implemented in a manner suitable for operation together with the circuit in FIG. 13. For this example, both the I-port 102-I and the Q-port 102-Q are assumed to be differential with input terminals 102-Ip, 102-In, 102-Qp, and 102-Qn. The part illustrated in FIG. 14 part comprises an operational amplifier 350 and resistors R4, R5, and R6. Resistor R6 is connected between the output and the negative input of the operational amplifier 350. The resistor R4 is connected between the input 102-Ip and the negative input of the operational amplifier 350. The resistor R5 is connected between the input 108 and the negative input of the operational amplifier 350. The positive input of the operational amplifier 350 is connected to signal ground. The output of the operational amplifier 350 is connected to the terminal BBIp (FIG. 13). The gain-control sub circuit 140a-I comprises an additional copy of the circuit in FIG. 14, but connected to terminals 102-In and BBIn instead of 102-Ip and BBIp. The gain-control sub circuit 140a-Q is constructed in the same way, replacing 102-Ip with 102-Qp, 102-In with 102-Qn, BBIp with BBQp, and BBIn with BBQn. The result is that the gain-control signal is added as a common-mode offset to the I and Q component of the analog input signal. This, in turn, alters the operating point of the Gilbert-type mixer in FIG. 13 to control the gain of the mixer circuit 100, and thereby the gain of the whole Tx circuit 30.

Figure 15:
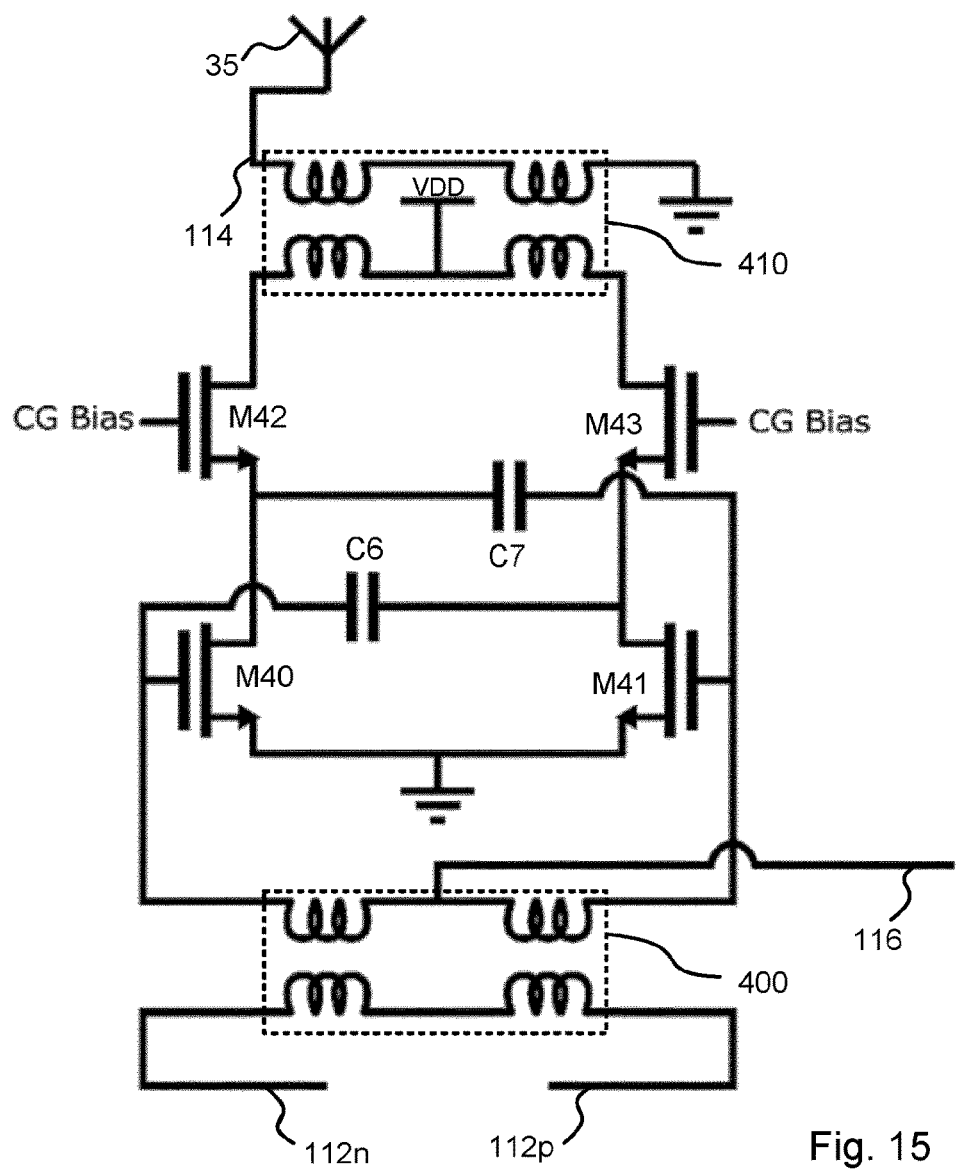

FIG. 15 is a schematic circuit diagram of an embodiment of the PA circuit 110 that can, for instance, be used in conjunction with embodiments of control circuit 120 configured to generate the gain-control signal as illustrated in FIG. 12. It should be noted that the embodiment of the PA circuit 110 illustrated in FIG. 15 is merely an example, and that other types of PA circuits may be used as well.

According to the embodiment illustrated in FIG. 15, the PA circuit 110 comprises an input stage of common source type. Said input stage comprises a differential pair of input transistors M40 and M41, which are configured to be biased with the gain-control signal at their gate terminals. Thereby, the gain of the PA circuit 110 is controlled by the gain-control signal. In this embodiment, the gain-control circuit 140b can be seen as incorporated with the other circuitry of the PA circuit 110. The gain-control signal may be supplied to the gate terminals of M40 and M41 in many different ways. In the embodiment illustrated in FIG. 15, the PA circuit 110 comprises a first transformer 400. A secondary winding of the first transformer 400 is connected between the gate terminals of M40 and M41. The first transformer 400 is configured to receive the gain-control signal at a center tap of the secondary winding, as indicated with the reference sign 116. Furthermore, the first transformer 400 is configured to receive the input signal of the PA circuit 110 across a primary winding, as indicated with the reference signs 112n and 112p. In FIG. 15, the source terminals of M40 and M41 are connected to a first supply terminal (ground).

As illustrated in FIG. 15, the PA circuit 110 may comprise additional transistor stages. For instance, in FIG. 15, the PA circuit 110 comprises a common gate stage connected to the common source input stage. Said common gate stage comprises a differential pair of transistors M42 and M43. M42 and M43 acts as cascode transistors for M40 and M41. In FIG. 15, M42 and M43 are biased with a bias voltage CG bias at their gate terminals.

As illustrated in FIG. 15, the PA circuit 110 may further comprise a second transformer 410. In FIG. 15, the second transformer 410 has a primary winding connected between the drain terminal of M42 and the drain terminal of M43. A center tap of the primary winding of the second transformer 400 is connected to a second supply terminal (VDD).

Furthermore, in FIG. 15, the second transformer 410 is configured to generate an output of the PA circuit 110 across a secondary winding, and deliver the output to the antenna, as indicated with reference signs 114 and 35 in FIG. 15.

As illustrated in FIG. 15, the PA circuit 110 may comprise further components, such as internal feedback capacitors C6 and C7

Figure 16:
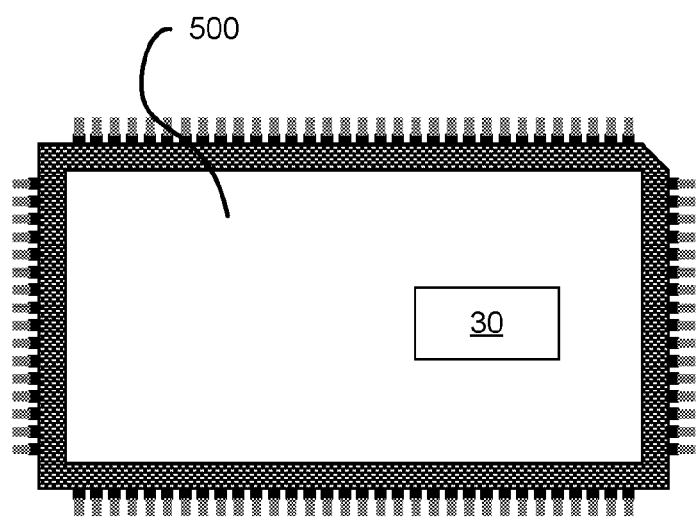
FIG. 16 schematically illustrates an integrated circuit comprising a transmitter circuit.

Embodiments of the Tx circuit 30 described herein are suitable for integration on an integrated circuit. This is schematically illustrated in FIG. 16, showing an integrated circuit 500 comprising the transmitter circuit 30.

Embodiments disclosed herein provide relatively simple circuitry facilitating counteraction of AM-PM and AM-AM distortion typically occurring in transmitter circuits, e.g. due to nonlinearities in power amplifiers.

The disclosure above refers to specific embodiments. However, other embodiments than the above described are possible within the scope of the disclosure. For example, the transmitter circuit 30 may be used in other types of electronic apparatuses as well. The different features of the embodiments may be combined in other combinations than those described.

The invention claimed is:

1. A transmitter circuit, comprising:
a signal input for receiving an analog input signal;
a local oscillator, LO, input for receiving an LO signal;
a mixer circuit configured to generate a frequency-upconverted signal, wherein the mixer circuit has a first input, a second input, and an output for outputting an output signal of the mixer circuit, and wherein the second input of the mixer circuit is connected to the signal input of the transmitter circuit;
a power amplifier, PA, circuit having an input connected to the output of the mixer circuit and an output for outputting an output signal of the transmitter circuit;

a control circuit configured to generate a phase-control signal and a gain-control signal in response to an envelope of the analog input signal;

a phase-control circuit configured to generate a phase-adjusted LO signal in response to the LO signal and the phase-control signal and to supply the phase-adjusted LO signal to the first input of the mixer circuit; and a gain-control circuit configured to control a gain of the transmitter circuit in response to the gain-control signal;

the gain control circuit being located in the mixer circuit and configured to operate on the analog input signal to generate an intermediate analog signal; and the mixer circuit being configured to generate the frequency-upconverted signal in response to the phase-adjusted LO signal and the intermediate analog signal, and to output the frequency-upconverted signal at the output of the mixer circuit.

2. The transmitter circuit of claim 1, wherein the gain-control circuit is comprised in the PA circuit.

3. The transmitter circuit of claim 1, wherein the control circuit has a digital input configured to receive a digital signal representing the envelope of the analog input signal.

4. The transmitter circuit of claim 1, wherein the control circuit is configured to generate an analog signal representing the envelope of the analog input signal from one or both of the analog input signal and from the output signal of the mixer circuit.

5. The transmitter circuit of claim 1, wherein the phase-control circuit comprises a variable capacitor, the capacitance of which is controlled by the phase-control signal.

6. The transmitter circuit of claim 1, wherein the phase-control circuit comprises a current-limiting circuit controlled by the phase-control signal.

7. The transmitter circuit of claim 1, wherein the phase-control circuit comprises a variable capacitor, the capacitance of which is controlled by the phase-control signal.

8. The transmitter circuit of claim 1, wherein the phase-control circuit comprises a current-limiting circuit controlled by the phase-control signal.

9. The transmitter circuit of claim 1, wherein the control circuit has a digital input configured to receive a digital signal representing the envelope of the analog input signal.

10. A transmitter circuit, comprising:
a signal input for receiving an analog input signal;
a local oscillator, LO, input for receiving an LO signal;
a mixer circuit configured to generate a frequency-upconverted signal, wherein the mixer circuit has a first input, a second input, and an output for outputting an output signal of the mixer circuit, and wherein the second input of the mixer circuit is connected to the signal input of the transmitter circuit;
a power amplifier, PA, circuit having an input connected to the output of the mixer circuit and an output for outputting an output signal of the transmitter circuit;
a control circuit configured to generate a phase-control signal and a gain-control signal in response to an envelope of the analog input signal;
a phase-control circuit configured to generate a phase-adjusted LO signal in response to the LO signal and the phase-control signal and to supply the phase-adjusted LO signal to the first input of the mixer circuit; and
a gain-control circuit configured to control a gain of the transmitter circuit in response to the gain-control signal;

the gain control circuit being located in the mixer circuit and configured to operate on the frequency-upconverted signal to generate a gain-adjusted frequency-upconverted signal; and the mixer circuit being configured to generate the frequency-upconverted signal in response to the phase-adjusted LO signal and the analog input signal, and to output the gain-adjusted frequency-upconverted signal at the output of the mixer circuit.

11. The transmitter circuit of claim 10, wherein the local oscillator, the mixer circuit, the power amplifier, the control circuit, the phase-control circuit and the gain control circuit are configured in an integrated circuit.

12. A transmitter circuit, comprising:
a signal input for receiving an analog input signal;
a local oscillator, LO, input for receiving an LO signal;
a mixer circuit configured to generate a frequency-upconverted signal, wherein the mixer circuit has a first input, a second input, and an output for outputting an output signal of the mixer circuit, and wherein the second input of the mixer circuit is connected to the signal input of the transmitter circuit;
a power amplifier, PA, circuit having an input connected to the output of the mixer circuit and an output for outputting an output signal of the transmitter circuit;
a control circuit configured to generate a phase-control signal and a gain-control signal in response to an envelope of the analog input signal;
a phase-control circuit configured to generate a phase-adjusted LO signal in response to the LO signal and the phase-control signal and to supply the phase-adjusted LO signal to the first input of the mixer circuit, the phase-control circuit comprising a variable capacitor having a capacitance controlled by the phase-control signal; and
a gain-control circuit configured to control a gain of the transmitter circuit in response to the gain-control signal.

13. The transmitter circuit of claim 12, wherein the gain-control circuit is comprised in the PA circuit.

14. The transmitter circuit of claim 12, wherein the local oscillator, the mixer circuit, the power amplifier, the control circuit, the phase-control circuit and the gain control circuit are configured in an integrated circuit.

15. A transmitter circuit, comprising:
a signal input for receiving an analog input signal;
a local oscillator, LO, input for receiving an LO signal;
a mixer circuit configured to generate a frequency-upconverted signal, wherein the mixer circuit has a first input, a second input, and an output for outputting an output signal of the mixer circuit, and wherein the second input of the mixer circuit is connected to the signal input of the transmitter circuit;
a power amplifier, PA, circuit having an input connected to the output of the mixer circuit and an output for outputting an output signal of the transmitter circuit;
a control circuit configured to generate a phase-control signal and a gain-control signal in response to an envelope of the analog input signal;
a phase-control circuit configured to generate a phase-adjusted LO signal in response to the LO signal and the phase-control signal and to supply the phase-adjusted LO signal to the first input of the mixer circuit, the phase-control circuit comprising a current limiting circuit controlled by the phase control circuit; and a gain-control circuit configured to control a gain of the transmitter circuit in response to the gain-control signal.

16. The transmitter circuit of claim 15, wherein the gain-control circuit is comprised in the PA circuit.

17. The transmitter circuit of claim 15, wherein the local oscillator, the mixer circuit, the power amplifier, the control circuit, the phase-control circuit and the gain control circuit are configured in an integrated circuit.

* * * * *